United States Patent [19]

Woolley

[11] Patent Number: 4,676,619
[45] Date of Patent: Jun. 30, 1987

[54] PORTABLE ENTERTAINMENT UNIT

[76] Inventor: Michel Woolley, 3633 SW. 22nd Ter., Miami, Fla. 33145

[21] Appl. No.: 837,044

[22] Filed: Mar. 6, 1986

[51] Int. Cl.$^4$ .................... G03B 17/48; G03B 29/00
[52] U.S. Cl. ........................................ 354/79; 354/76; 354/156; 354/288; 350/145; 362/253; 455/344
[58] Field of Search ............... 354/75, 76, 79, 288, 354/152, 155, 156; 350/145; 455/344; 362/253; 352/131

[56] References Cited

U.S. PATENT DOCUMENTS

| | | | |
|---|---|---|---|
| 2,765,718 | 10/1956 | Beecher | 354/79 |
| 2,858,751 | 11/1958 | Lopez | 455/344 |
| 2,868,098 | 1/1959 | Lopez | 455/344 |
| 2,882,791 | 4/1959 | Möller et al. | 354/76 |
| 3,439,598 | 4/1969 | Weitzner et al. | 354/76 |
| 3,882,521 | 5/1975 | Johannsen | 354/79 |
| 3,981,021 | 9/1976 | Beecher | 354/79 |
| 4,067,027 | 1/1978 | Yamazaki | 354/79 |

FOREIGN PATENT DOCUMENTS 586031  9/1933  Fed. Rep. of Germany ........ 354/76

Primary Examiner—A. A. Mathews
Attorney, Agent, or Firm—Anthony A. O'Brien

[57] ABSTRACT

A portable entertainment apparatus capable of being held in the palm of the hand includes a multitude of individual yet dependent components arranged within a cubic casing with at least one component operable from and accessible on each of the six planar walls of the casing. The components include binoculars, spot and floodlights; camera, tape recorder/player, AM-FM radio, calendar/clock, calculator and compass all disposed within the casing and having all exposed portions thereof either recessed or flush with the casing walls. The camera is normally fully hidden within the casing and utilizes, through a displaceable mirror, the lens of one of the binocular tubes both as a view finder and to direct an image to the camera shutter.

11 Claims, 11 Drawing Figures

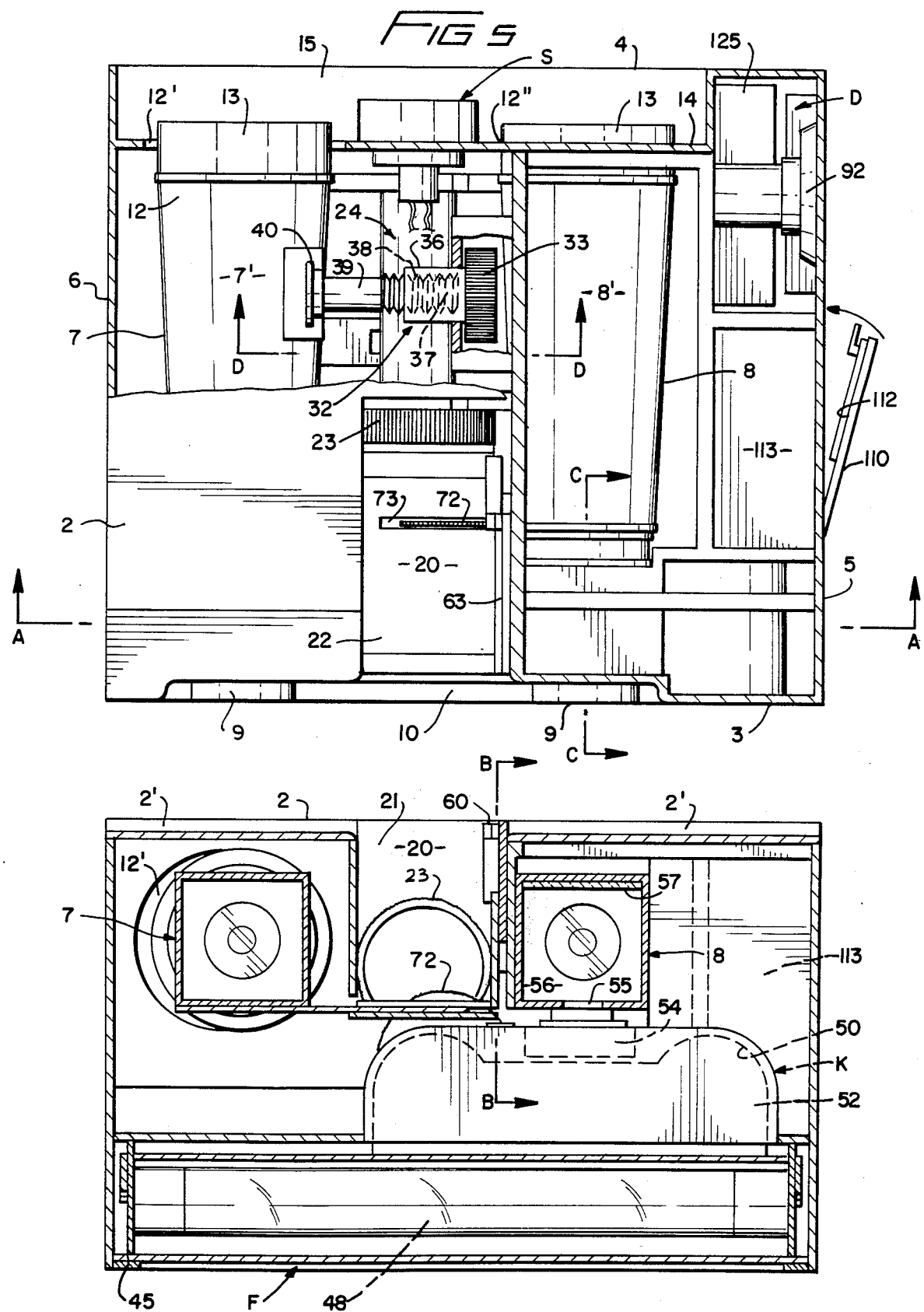

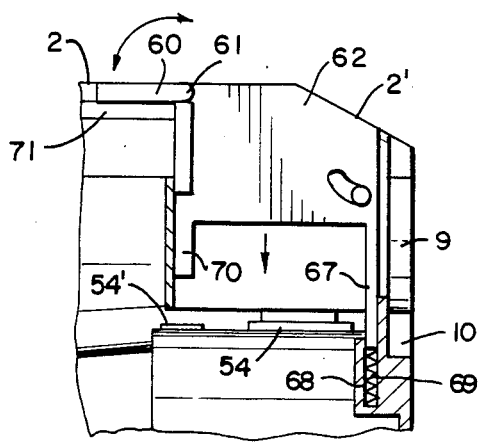
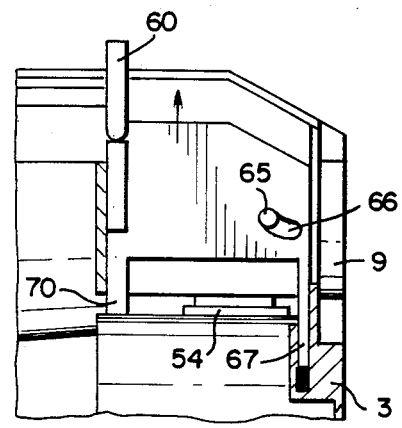
FIG 7
SEC. B-B
FIG 8
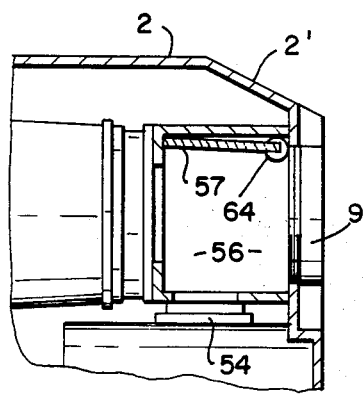
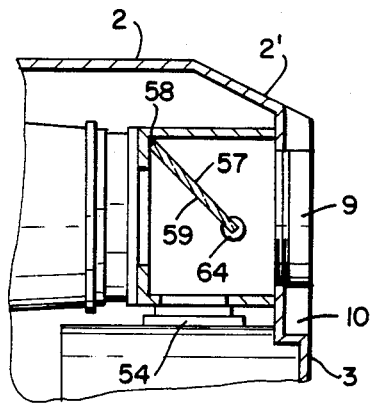
FIG 9
SEC. C-C
FIG 10
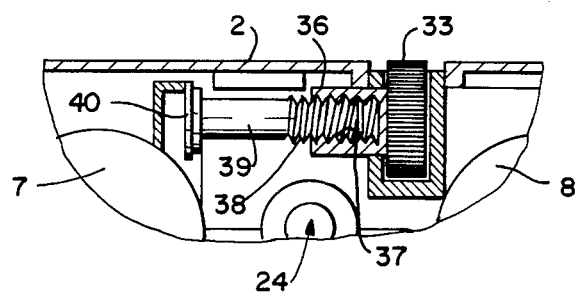
FIG 11
SEC. D-D

PORTABLE ENTERTAINMENT UNIT

This invention relates generally to an entertainment device and more particularly to an improved unitary portable device containing a plurality of separate, yet dependent, sub-systems arranged in a unique compact manner in a single casing.

Entertainment units comprising at least a pair of separate sub-systems are generally well known such as, for example, a combined radio and tape record/player. Most such prior devices are quite bulky and often merely comprise two separate independent systems mounted within a single casing and any dependence between the separate systems may or may not amount to no more than sharing a single power supply, volume control and/or speaker.

By the present invention, an improved assembly is provided wherein more than six different components or sub-assemblies are arranged in a novel manner within a single casing occupying substantially less than 1/10 cubic foot in volume and having a weight no more than that of many combination tape players/radios. Included in the present unit are: binoculars, spot-flashlight, camp-flood light, camera, tape player/recorder, AM-FM radio, calender/clock, calculator and compass. All of these components are fully contained within the unit's casing and all control knobs and switches therefor are flushly disposed with respect to the casing walls to preclude snagging of the user's clothing, inadvertant actuation of the switches and knobs, or breakage thereof.

The compact arrangement of such a large number of sub-assemblies or components is achieved by a unique interfitting of the many components into a most compact casing and by novel features such as the hinge mounting of the camp-floodlight to allow swinging away to permit insertion and removal of a film cartridge from the camera cavity located therebeneath. Full, normal manipulation of the binoculars is provided whereby one of the lens tubes is laterally adjustable to accommodate different user eye widths in addition to means being provided to allow for normal focusing between the eye-pieces and objective lenses. The optical axis striking the focal plane of the camera is disposed 90° with respect to one of the binoculars tubes such that by manipulating a camera control lever, a mirror is swung into position to provide a continuous optical path through that one binocular tube to the camera focal plane.

Accordingly, one of the objects of the present invention is to provide an improved portable entertainment unit comprising a large number of disparate components arranged in a cooperating manner in a single compact casing.

A further object of the present invention is to provide an improved portable entertainment unit comprising over six separate yet dependent sub-systems including binoculars and a camera with one of the binocular tubes alternately serving of the lens as the view-finder for the camera, the latter of which is mounted with its focal plane parallel to the axis of the binocular tube.

Still another object of the present invention is to provide an improved portable entertainment unit including more than six separate and dependent components including a spot flashlight mounted between the two tubes of a binocular subassembly as well as a fluourescent camplight.

Another object of the present invention is to provide an improved portable entertainment unit comprising more than six separate and dependent components including a camera fully contained within the casing of the entertainment unit and accessible for removal or loading of a film cartridge upon the pivotal displacement of a fluorescent camplight.

A further object of the present invention is to provide an improved portable entertainment unit comprising a main casing containing a plurality of separate yet dependent components including binoculars, spot-flashlight, camp floodlight, camera, tape recorder/player, AM-FM radio, calendar/clock. calculator and compass with a plurality of knobs and control switches for the various components all being flushly disposed with respect to the casing walls.

With these and other objects in view which will more readily appear as the nature of the invention is better understood, the invention consists in the novel construction, combination and arrangement of parts hereinafter more fully described, illustrated and claimed.

FIG. 5 is a bottom view partly in section illustrating the relative lateral adjustment between the binocular tubes and the alternate position of the pivotal storage compartment door;

FIG. 6 is a vertical sectional view taken along the line 6—6 of FIG. 5;

FIG. 7 is a fragmentary vertical sectional view taken along the line 7—7 of FIG. 6;

FIG. 8 is a view similar to FIG. 7 and illustrates the alternate position of the sliding control plate regulating the pivotal mirror and shutter release for the camera;

FIG. 9 is a vertical sectional view taken along the line 9—9 of FIG. 5;

FIG. 10 is a view simialr to FIG. 9 and illustrates the alternate position of the pivotal mirror; and FIG. 11 is a fragmentary vertical sectional view taken along the line 11—11 of FIG. 5, illustrating the lateral adjustment mechanism for the binocular tubes.

Similar reference characters designate corresponding parts throughout the several figures of the drawings.

Figure 1:
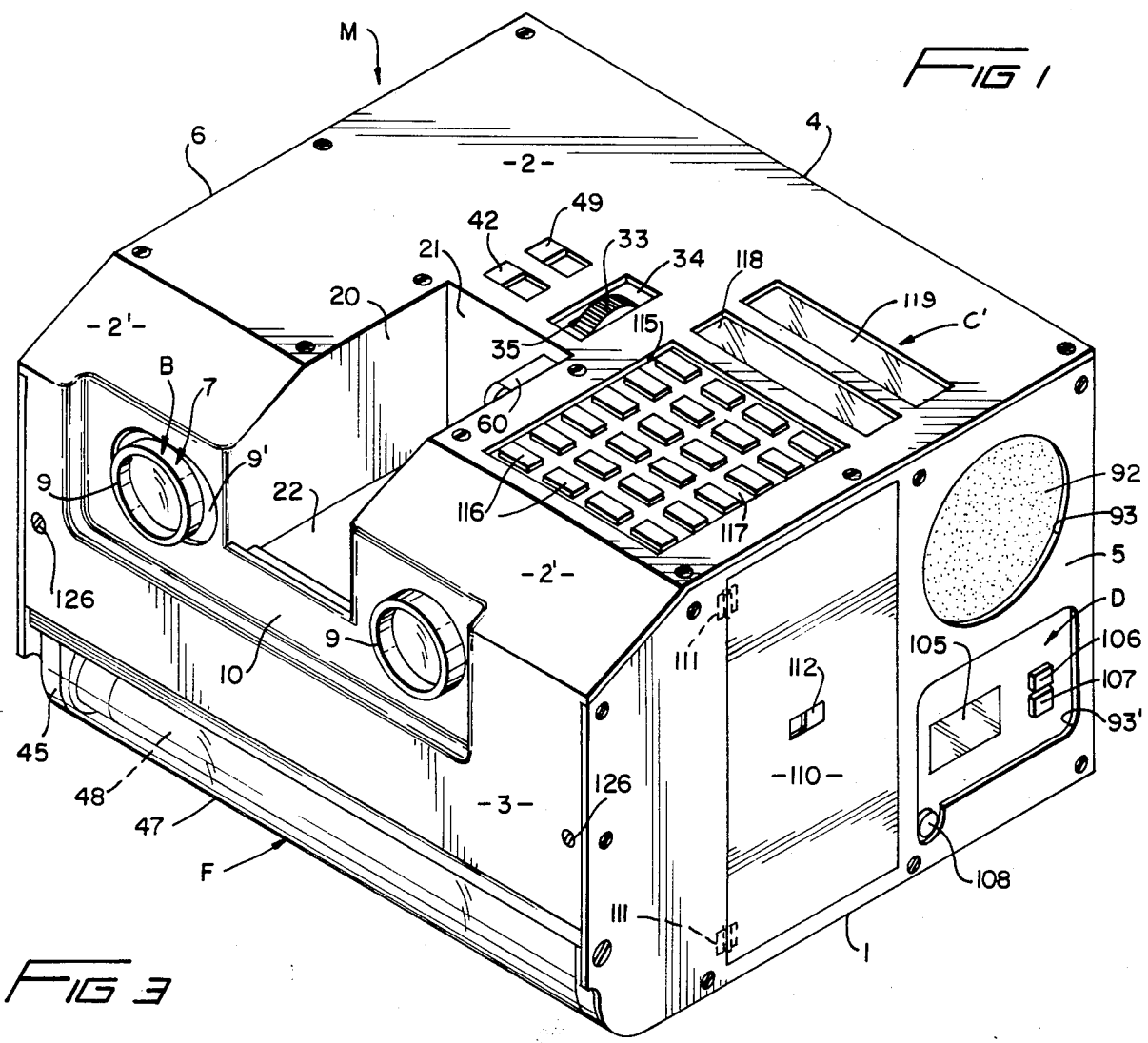
FIG. 1 is a perspective view illustrating the bottom, rear and left-side walls of the entertainment unit.

Referring now to the drawings, the present invention will be seen to comprise a main casing M of generally cubic configuration and formed by a planar exterior top wall 1, bottom wall 2, rear wall 3, front wall 4 and left and right side walls 5 and 6 respectively. Considering the multitude of subassemblies or components housed within the casing M, the overall dimensions thereof are suprisingly small, the entire unit readily fitting within the palm of the hand and describing an overall volume of substantially less than 1/10 a cubic foot. Fully contained within the casing M are a plurality of separate yet dependent sub-assemblies or components comprising binoculars B, spot-flashlight S, camp-floodlight F, camera K, tape recorder/player T, AM-FM radio R, digital calendar/clock D, calculator C' and compass C, with no portion of any of these components projecting outwardly beyond the plane of any of the walls 1-6 of the casing M.

Figure 3:
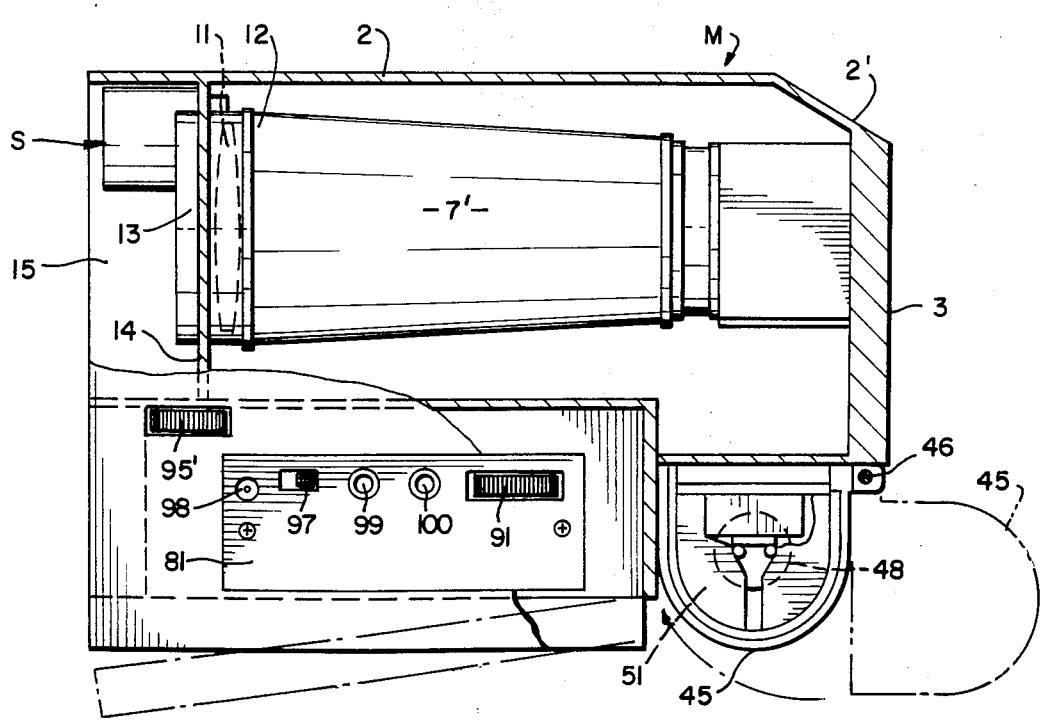
FIG. 3 is a cross-sectional view through the casing as viewed from the right-side of FIG. 2, showing alternate positions of the pivotal floodlight housing and tape access door.
Figure 2:
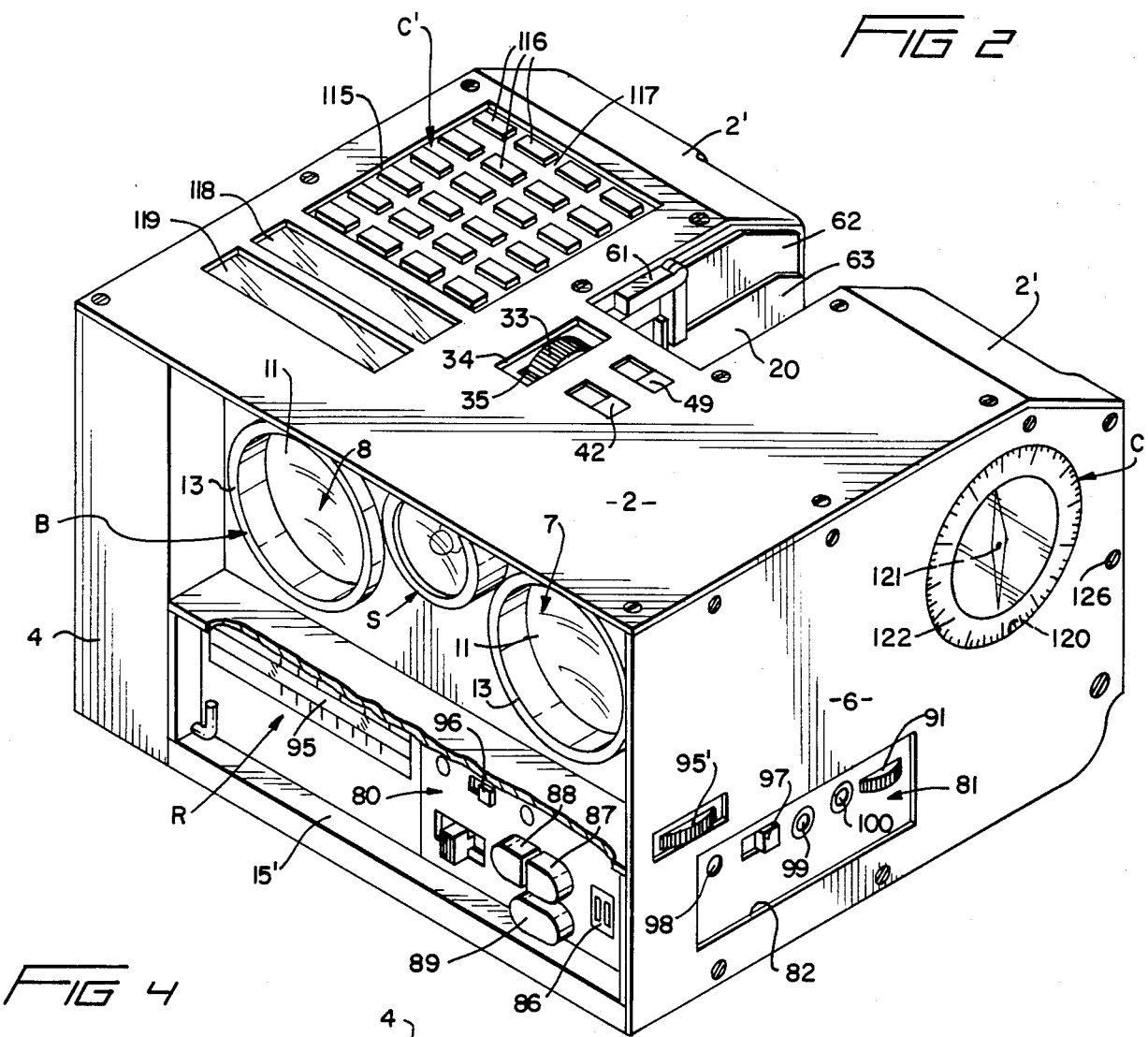
FIG. 2 is a perspective view illustrating the bottom front and right-side walls of the entertainment unit casing.

The binoculars B, shown most clearly in FIGS. 1-3, include a pair of tubes, first tube 7 and second tube 8, each provided with an eye-piece 9 at one end adjacent the casing rear wall 3. A recess or inwardly disposed area 10 is formed in this rear wall 3 and extends laterally beyond the width of the two eye-pieces, communicating with the bottom wall 2 such that the outermost edges of the two eye-pieces 9 do not project beyond the plane of the wall 3. Comfortable, efficient eye contact with the two eye-pieces 9—9 is assured in view of the indented disposition of the recessed wall 10 as shown most clearly in FIG. 1 of the drawings and through which the two eye pieces extend in an axially stationary relationship. Additionally, the beveled wall 2' extending the width of the casing provides a clearance for the user's cheek bones as well as offers a firm, positive gripping surface for one's thumbs. The opposite or forward portion of each binocular tube 7,8 contains the objective lens 11 adjacent the forward portion 12 thereof.

As shown in FIG. 3 of the drawings, each binocular tube comprises a main section 7' or 8' which comprises the majority of the axial extent of each tube and this will be understood to be axially displacable with respect to the axially stable eye-pieces 8-9 as is conventionally the case to provide for focusing of the binoculars with respect to images disposed at varying distances from the eyes of the user. In order to accommodate this adjustment and at the same time provide a rigid fixation of the binocular assembly within the casing M, the forwardmost portion 12 of each binocular tube 7-8 is slidably disposed within an axially fixed cylindrical bond 13 appropriately fitted within openings 12'-12" formed in a recessed wall 14 set back from the casing front wall 4 by means of a recess 15.

To allow a user to position the two binocular eye-pieces 8-9 close to their eyes, a tunnel, cut-out or channel 20 is formed in the casing bottom wall 2 and extends through the recessed wall 10 of the rear wall 3 as shown most clearly in FIGS. 1 and 2 of the drawings. In this manner the user grasps the two opposite sides of the casing and can readily utilize the binoculars with the tunnel 20 providing adequate clearance for the user's nose. The axial extent of the tunnel 20, that is, its distance from the casing rear wall 3 to its forward wall 21 is preferably at least two inches or well over one-third the depth of the casing between its front and rear walls 3,4 such that when in the position of use of the binoculars B, sufficient clearance between the bridge of the user's nose and this forward wall 21 exists. This allows the insertion of the user's thumb toward the tunnel base 22 wherein there is located a knob or wheel 23 connected to an appropriate binocular focus adjusting mechanism generally designated 24. By manipulation of this knob 23, the two binocular tube main sections 7',8' will be understood to be collectively axially displaced with respect to the stationary eye-pieces 9 and hoods 13 such that the objective lenses 11—11 are displaced as the forward portions 12 of the tubes slide within the axially stationary hoods 13.

In order to provide for fitting of the binocular tubes with respect to the eye spacing of various users, the right hand binocular tube 7 is mounted for lateral adjustment by means of an appropriate lateral adjustment mechanism, generally designated 32 and shown most clearly in FIGS. 5 and 11 of the drawings. This mechanism 32 is actuated by means of an adjusting wheel 33 flushly disposed with respect to the casing bottom wall 2 and which will be seen from FIGS. 1 and 2 to be disposed forwardly of the forward wall 21 of the tunnel 20. The recessed wall 34 surrounding the knurled wheel or knob 33 includes an elongated opening 35 providing a close tolerance to the exposed portion of the knob and thus precludes lateral displacement of the knob during its manipulation. This knob 33 is integral with an internally threaded sleeve 36, the internal threads 37 of which engage the threads 38 of a shaft 39. The opposite or outer end of the shaft 39 includes a fitting 40 appropriately journaled to the wall of the binocular tube 7 such that rotation of the knob 33 will be seen to axially extend or retract the shaft 39. In view of the fitting 40 which will be understood to be axially fixed with respect to the binocular tube 7, the entire tube is similarly laterally displaced. To accommodate this lateral displacement of the one binocular tube 7, the opening 12' in the recessed wall 14 as well as the opening 9' in the recessed wall 10 is cut-out or laterally elongated to provide a clearance to accommodate this adjustment between the two binocular tubes.

Positioned above the horizontal plane of the center of the two binocular tubes 7-8, and intermediate thereof in the area of the recessed wall 14, is a spot-flashlight S most clearly illustrated in FIGS. 2 and 5 of the drawings. A suitable switch 42 is accessible from the bottom wall 2 of the main casing M and like all other knobs and switches, is recessed with respect to its adjacent casing wall.

Figure 4:
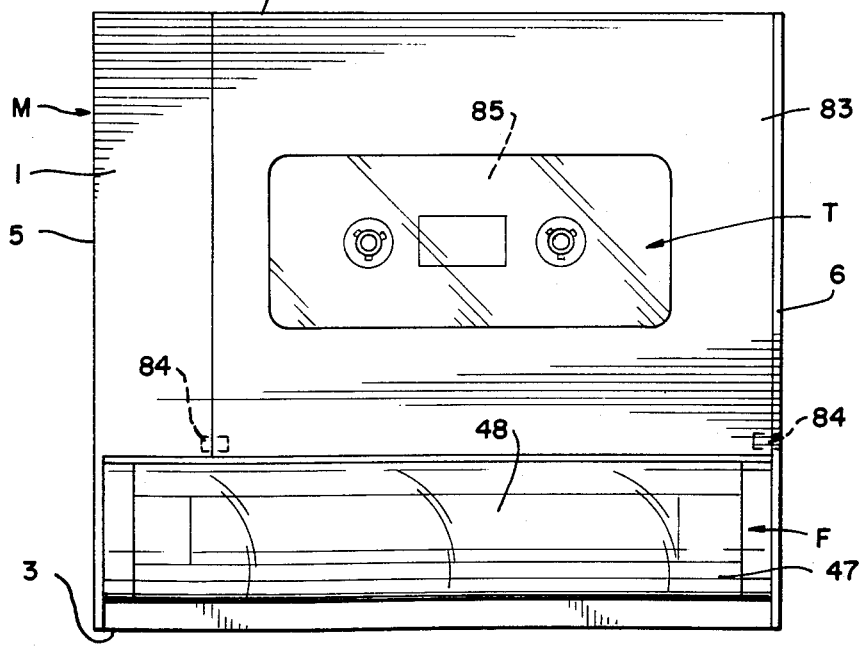
FIG. 4 is a top plan view of the entertainment unit.

As shown most clearly in FIGS. 3 and 4 of the drawings, the camp-light or floodlight, generally designated F, is disposed at the intersection of the top wall 1 and rear wall 3 of the main casing M and includes a housing 45 extending the full width of the apparatus. This housing 45 is appropriately hinge mounted as at 46, to the side walls 5 and 6 adjacent the rear wall 3 and is displaceable between the alternate positions shown in FIG. 3 of the drawings for reasons which will become obvious hereinafter. The housing 45 will be understood to include a transparent window 47 curved to conform to the illustrated configuration of the housing while disposed within the confines of this housing is an elongated fluourescent tube 48. Operation of the floodlight F is accomplished by manipulation of a switch 49 preferably located adjacent the spotlight switch 42 on the casing bottom wall 2.

Mounted within the casing M just inside the rear wall 3 and adjacent the binocular tube 8, is the camera K shown most clearly in FIG. 6 of the drawings. This camera preferably is of the pocket instamatic type utilizing film size 110 and access to the film receiving cavity 50 thereof is achieved by displacement of the floodlight housing 45 to the broken line position of FIG. 3. When thusly displaced, the floodlight receiving cavity 51 is exposed and a film cartridge 52 is readily inserted into the film receiving cavity 50 of the camera K.

Mechanism for actuating the camera K will best be understood with reference to FIGS. 6-10. A unique feature is that the camera and its contained film cartridge 52 will be seen to be disposed with the optical axis thereof extending parallel to the front and rear walls 4-3 of the casing M and thus perpendicular to the optical axis of the binocular tubes 7-8. The camera shutter 54 will be seen to be juxtaposed the wall of the binocular tube 8 immediately forward of its eye-piece 9. An opening 55 is provided in the wall of the tube 8 for communication between the interior 56 of the binocular tube and the camera shutter 54. With particular reference to FIGS. 9 and 10, it will be noted that a mirror 57 is contained within the binocular interior 56 and is suitably pivotally attached therein as at 58 for displacement between the alternate positions depicted in FIGS. 9 and 10. FIG. 9 illustrates the mirror 57 in the retracted position wherein it is juxtaposed one wall of the binocular tube away from the optical axis of the binocular tube while the alternate position of FIG. 10 illustrates the mirror 57 in its camera-active position wherein its mirrored surface 50 is disposed at a 45° angle with respect to both the binocular tube optical axis as well as the optical axis leading through the binocular tube opening 55 and into the camera shutter 54. When in this latter position, it follows that images received through the objective lens 11 of the binocular tube 8 will strike the mirrored surface 59 and be redirected 90° toward the camera shutter 54 such that manipulation of this shutter will allow capture of the viewed image by the film contained within the film cartridge 52.

To utilize the camera the operator employs the binoculars B of the entertainment unit as a view-finder and the resultant operation is analogous to that of a reflex camera in that the subject to be photographed is viewed through the same lens (11) subsequently serving to direct the image to the camera shutter. Accordingly, the user views the desired subject with the binoculars B, focusing same as necessary by means of the knob or wheel 23 as previously described and when the picture is ready to be snapped, manipulates a control lever 60 to initially displace the mirror 57 to the camera active position of FIG. 10 and subsequently trips the camera shutter 54.

Control lever 60 comprises an elongated member pivotally attached as at 61 to a sliding mirror control plate 62 contained adjacent one side of the tunnel 20 extending through the bottom wall 2 and rear wall 3 of the casing M. The control plate 62 is adapted for vertical displacement between the alternate positions of Figs. 7 and 8 and is contained within a single vertical plane by means of a vertical support wall 63 illustrated in FIGS. 5 and 6. The normal position of the control plate 62 is as shown in FIG. 7 wherein this plate is elevated and the control lever 60 is horizontally disposed in an offset manner to retain the control plate in this position. When thusly elevated, a mirror control rod 64 carried by the free end of the mirror 57 is retained in the retracted position of FIG. 9 as an end portion 65 thereof is captively disposed within a slot 66 in the mirror control plate 62.

In this normal position, it will be seen that the user is free to employ the binoculars as the mirror 57 is retracted from interference with the optical axis of the binocular tube 8 whereas when the control lever 60 is manipulated to displace the mirror control plate 62 to the position of FIG. 8, the control plate slot 66 moves the engaged end portion 65 of the mirror control rod 64 to position the mirror 57 as shown in FIG. 10. In this latter camera-active position, a control plate arm 67 projects into a recess 68 in the casing rear wall 3 and engages a small compression spring 69 therein. At this point, the user is ready to trip the shutter 54 of the camera. Subsequent displacement of the control plate 62 by means of continued pressure on the extended control lever 60 against the force of the spring 69, causes a camera shutter actuating arm 70 on the control plate 62 to actuate the shutter release 54'. Releasing finger pressure upon the control lever 60 after tripping the camera shutter, allows the spring 69 to clear the actuating arm 70 from the shutter tripping mechanism whereafter a subsequent photograph may be taken or the binoculars used in the conventional manner. Following return of the mirror control plate to the normal position of FIG. 7, the mirror control plate 62 is retained in the normal inactive position by displacing the control lever 60 about its pivot 61 to a position flushly engaging a stationary control lever stop 71, in which position the control lever 60 will be flushly disposed with respect to the casing bottom wall 2.

The camera K includes a film advance knob or wheel 72 with a portion of its periphery extending through an opening 73 formed in the base wall 22 of the tunnel 20. This knob 72 operates in a well known manner to initially advance a newly inserted film cartridge 52 to its first exposure position and to subsequently advance each frame of the film following the taking of each photograph.

The tape recorder/player T is mounted within the casing M adjacent the top wall 1, right side wall 6 and front wall 4. Included are operator controls located on a control panel 80 accessible within a recess 15' in the front wall 4 as well as a secondary control panel 81 likewise recessed as at 82 in the right side wall 6. The majority of the casing top wall 1 includes a tape access door 83 hinged as at 84 adjacent the floodlight F to allow insertion and removal of the desired tape cassette (not shown) in the tape cartridge cavity 85.

The specific construction of the tape recorder/player T itself is immaterial and quite obviously a compact arrangement is desired. Most importantly, the illustrated controls must be provided to allow operation of the tape recorder/player in the subject entertainment unit. The control panel 80 includes a microphone 86 together with the other frequently employed controls including a receive button 87, play button 88 and stop button 89. A rewind switch 90 must also be provided. The remaining necessary control required for operation of the tape recorder/player T comprises the volume control 91 which will be seen to be contained in the secondary control panel 81 on the right side wall 6 of the casing. The speaker 92 serving the tape recorder/player is located on the opposite or left wall 5 and likewise is suitably recessed as at 93. The speaker also serves the AM-FM radio now to be described.

The AM-FM radio R is contained within the casing M intermediate the tape cartridge cavity 85 and the binoculars B and includes a tuning dial 95 viewable in the base of the recess 15' of the front wall 4 adjacent the tape recorder/player control panel 80. This control panel also includes a selector switch 96 operable to alternatively control the tape recorder/player T and radio R. The same volume control 91 located on the secondary control panel 81 that serves the tape recorder/player T controls the volume of the radio R and this latter control panel also includes a selector switch 97 to allow switching between the AM and FM radio bands. Adjacent the selector switch 97 are accessory jacks including ones for an external power supply 98, external antenna 99 and external microphone 100. The latter is utilized with the tape recorder/player while the antenna jack 99 serves the radio R. An external source of power may be connected with the jack 98 to operate both the radio R and tape recorder/player T. A radio tuning knob 95' is flushly disposed on the right side wall 6.

Mounted on the main casing left side wall 5 adjacent the radio and tape player speaker 92, is a digital calendar/clock D the outer surface of which is likewise recessed as at 93'. This component includes an indicia display 105, a mode button 106 and set button 107 allowing the selection and alternate display of the time and date. Additionally, a light button 108 is included to illuminate the display 105 when the entertainment unit is used in the dark.

On the same left side wall 5, adjacent the speaker 92 and calendar/clock, is a storage door 110 pivoted as at 111 and provided with a flushly disposed door catch 112. Releasing the catch 112 and opening the door 110 as depicted in FIG. 5 of the drawings permits access to a storage compartment 113 therebehind offering a convenient means for receiving spare batteries and/or film for use with the entertainment unit.

The calculator C' located on the casing bottom wall 2 again is recessed as at 115 such that the plurality of buttons 116 projecting upwardly from the keyboard 117 do not project above the surface of the wall 2. Above the top row of calculator buttons 116 is a digital window 118 and adjacent thereto is a solar-cell window 119 capable of converting natural or artifical light into electrical energy suitable for operation of the calculator C'.

The remaining component of the entertainment unit comprises a compass C recessed as at 120 within the right side wall 6. The needle 121 of the compass cooperates with a flushly disposed azimuth bezel 122.

Power to operate the plurality of components is supplied by one or more batteries disposed within the casing M. Typically, a high energy alkaline battery 125 may be employed and conveniently located behind the calendar/clock D on the left side wall 5 as shown in FIG. 5.

To facilitate carrying of the unit, strap mounting means are provided comprising a pair of communicating openings 126—126 at each rear corner of the casing as shown in FIG. 1. With this arrangement, the two ends of any suitable carrying strap (not shown) can be attached through the two openings 126—126 at each casing rear corner. Quite obviously, the openings may be positioned at points along the unit's center of gravity to insure suspension in a balanced manner.

In summary, it will be noted that not only are all of the plurality of individual components of the unit fully contained within the bounds of the casing walls 1-6 but also all control elements (knobs, buttons and switches) employed to actuate the components are likewise at least flushly disposed with respect to these casing walls.

I claim:

1. A portable entertainment unit including a substantially cubic casing provided with a plurality of exterior walls, a plurality of individual components mounted within said casing including binoculars, camera, tape recorder/player, radio and calculator, said casing exterior walls comprising front, rear, top, bottom and left and right side walls, said binoculars including first and second tubes extending between said rear and front walls each having an eye-piece and an objective lens respectively adjacent said rear and front walls, one said casing wall adjacent said rear wall provided with a cut-out extending through said rear wall intermediate said tubes to accommodate a user's nose, said camera having a shutter disposed adjacent to and perpendicular to one said binocular tube, shiftable means initially operable to re-direct an image viewed through said one binocular tube to said camera shutter and said shiftable means further operable to activate said camera shutter.

2. A portable entertainment unit according to claim 1 including, a digital calendar/clock on one said casing wall and a compass on another one said casing wall.

3. A portable entertainment unit according to claim 1 including, a flood light and spot light in said casing.

4. A portable entertainment unit according to claim 1 wherein, all said components are normally flushly disposed relative respective ones of said casing walls.

5. A portable entertainment unit according to claim 1 including, a flood light in said casing comprising a fluorescent tube mounted in a housing having a transparent window, said housing disposed between said side walls and normally flush with said rear wall and top wall, said camera including a film receiving cavity within said casing, and said flood light housing pivotally displaceable from its normally flush position to an open position exposing said camera cavity to allow insertion and removal of a film cartridge.

6. A portable entertainment unit according to claim 1 wherein, said shiftable means includes a control lever disposed within said nose cut-out, a mirror within one said binocular tube displaceable between alternate positions upon actuation of said control lever, and said alternate positions comprising a 45° displacement of said mirror.

7. A portable entertainment unit according to claim 1 including, a spot light within said casing disposed between said two binocular tube objective lenses, a switch on said casing bottom wall operable to actuate said spot light whereby, a user may illuminate a field of view while using said binoculars.

8. A portable entertainment unit according to claim 1 wherein, said nose cut-out additionally extends through said casing bottom wall, a focus adjusting mechanism within said casing for axially displacing at least one said binocular tube, a knob within said cut-out manipulable to operate said focus adjusting mechanism, a lateral adjusting mechanism within said casing for laterally displacing one said tube, and a knob on said casing bottom wall manipulable to operate said lateral adjusting mechanism.

9. A portable entertainment unit according to claim 1 wherein, said casing rear wall is provided with an opening at each end communicating with an adjacent opening in said right and left side walls respectively, and said two pairs of communicating openings located at the center of gravity of said casing to permit attachment of a carrying strap.

10. A portable entertainment unit according to claim 2 including, dry cell power means within said casing providing electrical energy for operation of said tape recorder/player, radio, flood light and spot light, and said calculator including a solar cell providing energy for its operation.

11. A portable entertainment unit according to claim 6 including, a shutter release on said camera within said casing, said shiftable means including a control plate attached to said control lever, a shutter activating arm on said control plate, spring means in said casing normally urging said control plate and activating arm away from said shutter release, and a film advance knob within said cut-out operable to advance film within said camera.

* * * * *